(12) United States Patent
Gottwald et al.

(10) Patent No.: US 8,811,019 B2
(45) Date of Patent: Aug. 19, 2014

(54) ELECTRONIC DEVICE, METHOD FOR PRODUCING THE SAME, AND PRINTED CIRCUIT BOARD COMPRISING ELECTRONIC DEVICE

(75) Inventors: Thomas Gottwald, Dunningen-Seedorf (DE); Christian Rossle, St. Georgen (DE)

(73) Assignee: Schweizer Electronic AG, Schramberg (DE)

( * ) Notice: Subject to any disclaimer, the term of this patent is extended or adjusted under 35 U.S.C. 154(b) by 0 days.

(21) Appl. No.: 13/885,437

(22) PCT Filed: Nov. 24, 2011

(86) PCT No.: PCT/EP2011/005912
§ 371 (c)(1),
(2), (4) Date: Aug. 20, 2013

(87) PCT Pub. No.: WO2012/072212
PCT Pub. Date: Jun. 7, 2012

(65) Prior Publication Data
US 2013/0329370 A1    Dec. 12, 2013

(30) Foreign Application Priority Data
Nov. 29, 2010   (DE) .......................... 10 2010 060 855

(51) Int. Cl.
*H05K 7/20*  (2006.01)
*H05K 1/18*  (2006.01)
*H01L 23/00* (2006.01)
*H05K 3/30*  (2006.01)
*H01L 23/538* (2006.01)

(52) U.S. Cl.
CPC ............ *H05K 7/20427* (2013.01); *H01L 24/24* (2013.01); *H01L 2924/01074* (2013.01); *H01L 2224/18* (2013.01); *H05K 3/30* (2013.01); *H01L 2924/01013* (2013.01); *H01L 2924/01047* (2013.01); *H01L 2924/01082* (2013.01); *H01L 2924/01327* (2013.01); *H05K 1/183* (2013.01); *H01L 2924/01079* (2013.01); *H01L 2224/92144* (2013.01); *H05K 2201/066* (2013.01); *H01L 2924/01029* (2013.01); *H01L 2924/01023* (2013.01); *H01L 2224/73267* (2013.01); *H01L 24/82* (2013.01); *H01L 2924/01005* (2013.01); *H01L 2924/0102* (2013.01); *H01L 23/5389* (2013.01)
USPC ........... 361/719; 361/704; 361/707; 361/720; 361/761; 361/764; 174/252; 174/260

(58) Field of Classification Search
USPC ............ 361/704, 707, 719, 761, 764; 29/846; 165/185; 174/252, 260
See application file for complete search history.

(56) References Cited

U.S. PATENT DOCUMENTS

| 7,947,906 | B2 * | 5/2011 | Lee et al. ....................... 174/252 |
| 8,305,762 | B2 * | 11/2012 | Wits et al. ..................... 361/720 |
| 2008/0251903 | A1 | 10/2008 | Otremba |

FOREIGN PATENT DOCUMENTS

| DE | 100 31 952 A1 | 4/2001 |
| DE | 10 2009 013 818 | 11/2009 |

OTHER PUBLICATIONS

The International Bureau of WIPO, International Preliminary Report on Patentability, Jun. 13, 2013, PCT/EP2011/005912.

*Primary Examiner* — Robert J Hoffberg
(74) *Attorney, Agent, or Firm* — Shlesinger, Arkwright & Garvey LLP

(57) ABSTRACT

An electronic device comprising an electrically conductive core layer with a first layer composed of electrically conductive material, the first layer being applied on both sides and with at least one electronic component arranged in a cutout of the first layer, wherein the first layer is covered in each case with an electrically insulating, thermally conductive layer and a further layer composed of electrically conductive material is provided in each case on the thermally conductive layer, the further layer being coated in each case with a covering layer composed of electrically conductive material, and furthermore having plated-through boles composed of the material of the covering layer, which extend through the electrically insulating, thermally conductive layer covering the electronic component and the further layer composed of electrically and thermally conductive material for the purpose of making contact with the electronic component.

18 Claims, 11 Drawing Sheets

US 8,811,019 B2

ELECTRONIC DEVICE, METHOD FOR PRODUCING THE SAME, AND PRINTED CIRCUIT BOARD COMPRISING ELECTRONIC DEVICE

FIELD OF THE INVENTION

The present invention relates to an electronic device as well as a method for producing the same.

BACKGROUND OF THE INVENTION

DE 10 2009 013 818 A1 discloses a method for making an electronic device wherein, after providing a support with a first conductive layer, a first insulating layer is applied on this first conductive layer and at least one through connection from a first side of the first insulating layer to a second side of the first insulating layer is created. At least two semiconductor chips are mounted on the support and a second insulating layer applied on the support. The second insulating layer is then opened until the support is uncovered and a metal layer is deposited above the exposed second insulating layer, after which the two or more semiconductor chips are separated.

SUMMARY OF THE INVENTION

By contrast, this invention proposes an electronic device with the features as disclosed herein, a method for producing the same with the features as disclosed herein, as well as a printed circuit board comprising devices according to the invention with the features as disclosed herein and a method integrating an electronic device into a printed circuit board with the features as disclosed herein.

The device in accordance with the invention represents a less expensive alternative to embodiments made from ceramics. In comparison with embodiments made from ceramics, the device is also significantly less susceptible to breakage. As the long aluminum bond wires usually used are replaced with short vias of copper, ON-state resistance is markedly reduced. Furthermore, the design of the invention permits a reduction in chip size, as the galvanic contact employed requires a smaller surface area than the bond wires otherwise commonly used. Due to the symmetrical layer structure, the device also exhibits an increased planarity. The difference in thermal expansion coefficients between the chips and the contacts is reduced, resulting in increased reliability. A further advantage is that the electrical insulation, e.g. from a motor housing, is already integrated into the device module via the dielectric. The device hereby produced can be integrated directly into a printed circuit board, representing a cost-efficient comprehensive solution.

Additional advantages and embodiments of the invention may be drawn from the description and accompanying drawings.

It is evident that the features mentioned above and those yet to be explained below may be applied not only in the combinations indicated, but also in other combinations or individually, without leaving the scope of the present invention.

The invention is represented for illustrative purposes by means of exemplary embodiments depicted via schematic drawings (not to scale) and is described in detail as follows by referring to the drawings.

BRIEF DESCRIPTION OF THE DRAWINGS

FIG. 9 shows an embodiment of a finished electronic device in accordance with the invention.

FIG. 10 shows a printed circuit board comprising an integrated device in accordance with the invention, illustrated in cross-section.

DETAILED DESCRIPTION OF THE INVENTION

Figure 1:
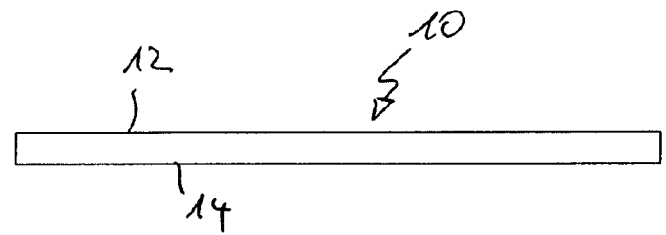
FIGS. 1 to 3 illustrate the making in accordance with the invention of an initial semi-finished product in producing an electronic device.

In accordance with the method of the invention, a substrate 10 of electrically conductive material having an upper side 12 and a bottom side 14 is provided (FIG. 1). This substrate may be, e.g., a copper sheet, but other conductive materials known to the person skilled in the art are also possible. Copper exhibits three useful qualities, namely high electrical conductivity, high thermal conductivity, and—in comparison with other materials demonstrating similar conductive qualities—may be acquired at reasonable cost. The dimensions of the substrate 10 may be chosen by the person skilled in the art as appropriate to a particular case and taking into account the specific requirements. Typical dimensions might be, e.g., 600 mm×600 mm with a thickness of 0.2 to 1 mm.

Optionally, a less expensive metal may be used that exhibits etching characteristics different from those of the deposited metal, with the consequence that only the support may be selectively etched. Thus, e.g. previously copper-plated aluminum may be used as a support material. This would potentially permit savings of both cost and weight.

In a next step, a first layer 16 of electrically conductive material is applied to the substrate 10. The first layer 16 is applied to the upper side 12 and/or the bottom side 14 of the substrate 10. This application may be carried out e.g. via deposition (plating, galvanic/electrochemical deposition) or via other suitable technical means (such as, e.g., sputtering, vacuum deposition, etc.) known to the person skilled in the art.

Figure 3:
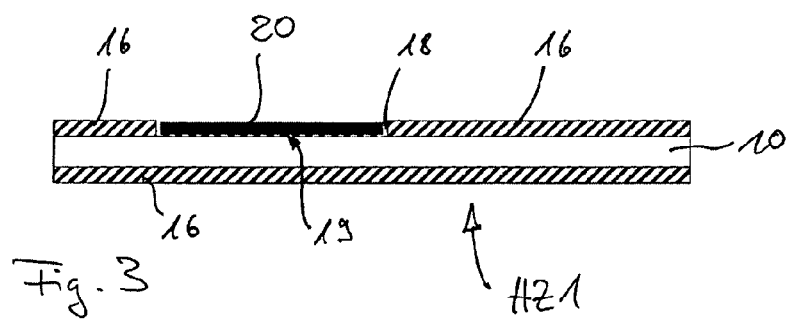

The application of the first layer 16 onto the substrate 10 in accordance with the invention is carried out in such a way that at least one cutout 18 is created. The dimensions (bottom surface area and depth) of the cutout 18 are chosen in such a way that the cutout 18 can receive a desired electronic component 20 (cf. FIG. 3), which in a next step is inserted into the cutout 18 and lying on the substrate 10. This electronic component 20 may be, e.g., a power semiconductor or other comparable component. The depth d of the cutout 18 is chosen for example such that the height of the component 20 to be inserted plus a connective layer 19 to be provided between the substrate 10 and a bottom side of the component 20 is somewhat less than the depth d of the cutout. Or in other words: the plating (layer 22) is somewhat thicker than the component to be inserted plus the connective layer. The connective layer 19 may be, e.g., a solder layer, an organic layer, or a suitable adhesive. The surface of the substrate 10 in the area of the cutout 18 may optionally be provided with a suitable precious metal (e.g. Ag, Au, Sn or equivalent) to form a contact surface for the component. Through an appropriate combination of coating material for the electronic component (or the chip) 20 and coating of the surface of the substrate 10, compounds may be created which exhibit a higher melting point after soldering than before soldering. This may be attained e.g. with the combination of gold (Au) on the component and tin (Sn) on the substrate. Sn melts at 232° C., at which point the soldering process occurs. During this process, intermetallic AuSn phases are created with a melting point above 232° C. This prevents later remelting during further processing.

The surfaces of the electronic component are formed in such a way that the bottom side is designed to work with the intended method of attachment, e.g. with a solderable surface if soldering is intended. The upper side of the component is formed in such a manner as to be suited to later galvanic contact formation, e.g. by copper-plating of the contact surfaces.

The described procedure in accordance with the invention of creating a cutout to receive the chip or other component has the advantage that the component is protected during a later process step of pressing together/laminating from the effects of mechanical pressure, as the height of the plating (and thus the depth d of the cutout) is chosen to be slightly greater than the thickness of the component plus the connective layer. This ensures that the surface of the component is located sufficiently below the surface of the layer 22 so that no damaging pressure is exerted on the component during pressing. The creation of the cutout by means of the application of a conducting layer around the cutout has the advantage that the cutout has right angles and vertical surfaces (which can otherwise only be achieved with great difficulty, and not through etching), so that the cutout can be formed to very precisely fit the dimensions of the component to be inserted.

Any recesses provided around the component 20 to compensate for mounting tolerances may be filled after completion of the installation and soldering process with a suitable material, e.g. with a standard casting compound.

After the insertion of the component 20 in the designated cutout 18 as already described, the first semi-finished product HZ1 is complete.

Figure 4:
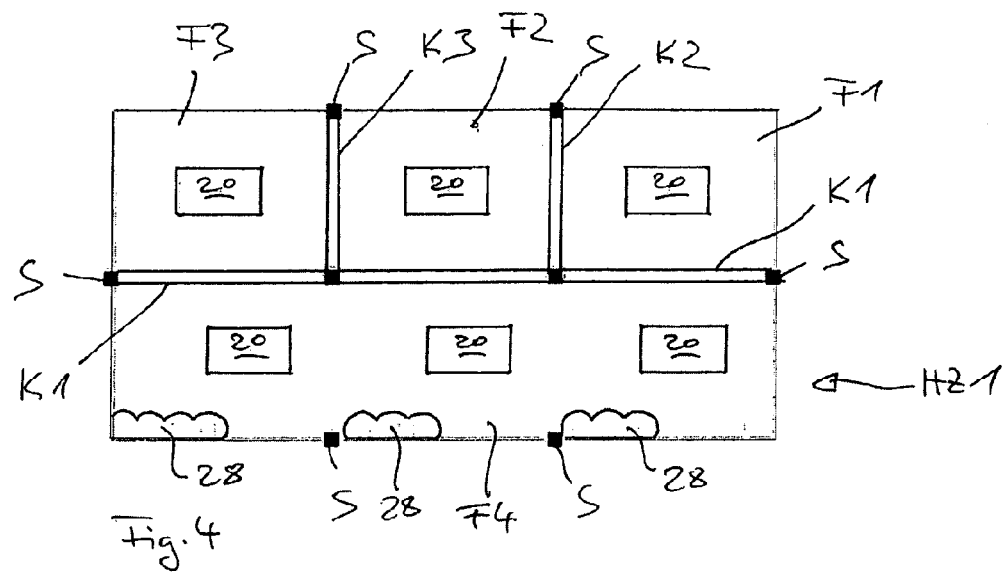
FIG. 4 depicts a plan view of a layout of an embodiment of the first semi-finished product.

In an embodiment, the first semi-finished product may be provided with fields or arrays F1, F2, F3, F4 defined by channels K1, K2, K3 (cf. FIG. 4). These fields F1, F2, F3, F4 are intended to be electrically insulated from one another upon completion. To this end, channels K1, K2, K3 are generated in the first layer 16 and the substrate 10, e.g. by means of etching; at this point, the channels (still) possess studs S which extend transversely through the channels K1, K2, K3 and mechanically connect them, and which serve to provide stability (retaining studs). After the laminating process (to be described below), these retaining studs are removed by means of suitable processes, e.g. by drilling, routing, stamping, etc. In this way, potential-separated areas are created in the electronic device. The semicircular or partially circular recesses 28 discernible in the lower area of the first semi-finished product HZ1 in the illustration of FIG. 4 provide potential separation (potential isolation) for through holes in the finished device. The fields F1, F2, F3, F4 created as described above serve in accordance with the invention to provide surfaces for heat spreading for the electronic components 20. The size of each field F1, F2, F3, F4 is chosen in such a manner that the heat spreading surface allocated to each mounted component is practically identical.

Figure 6:
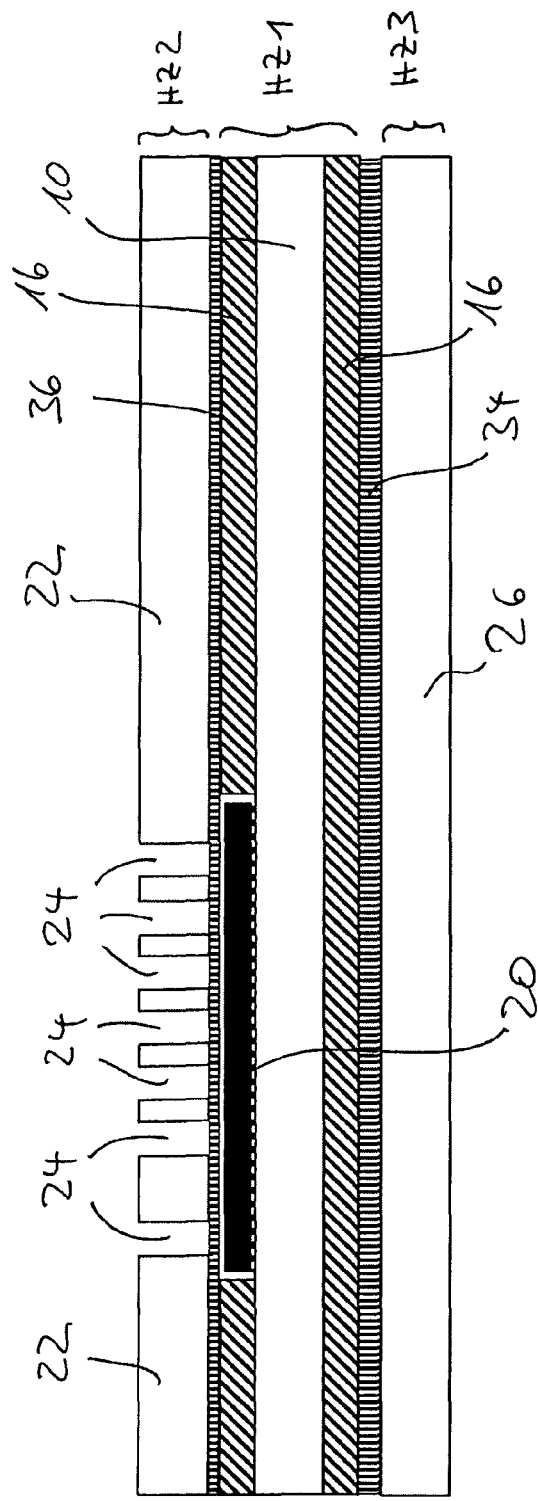
FIGS. 6 to 8 illustrate the placement, lamination, and further processing of the three semi-finished products in producing an electronic device.

The channels described may be filled in before the actual laminating process, in order to reduce the quantity of resin which must be injected into the layer structure before the pressing process (cf. FIG. 6). This may be necessary, for example, if, on the one hand, very narrow insulation clearances between the three semi-finished products HZ1, HZ2, and HZ3 are desired, and on the other, long and wide channels are to be filled in. This may be accomplished e.g. by means of a printing process or a roller coater. The resin need not be especially thermally conductive.

The fields or arrays described above serve in the context of an aspect of the present invention to assign identical device surfaces for "symmetrical" heat spreading to the components to be arranged on the fields/arrays. In this regard, "symmetrical" means that the heat generated by the components in operation is conducted away evenly due to the identically-sized surfaces assigned to each, as also explained below with reference to the illustration in FIG. 9.

Figure 2:
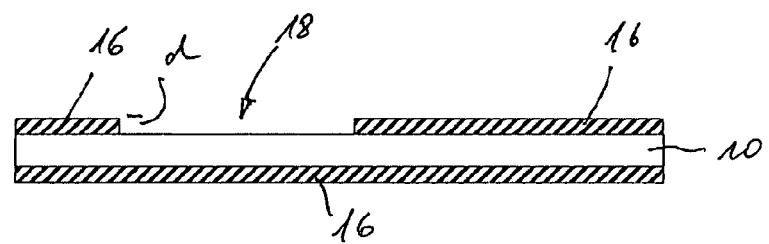
Figure 2A:
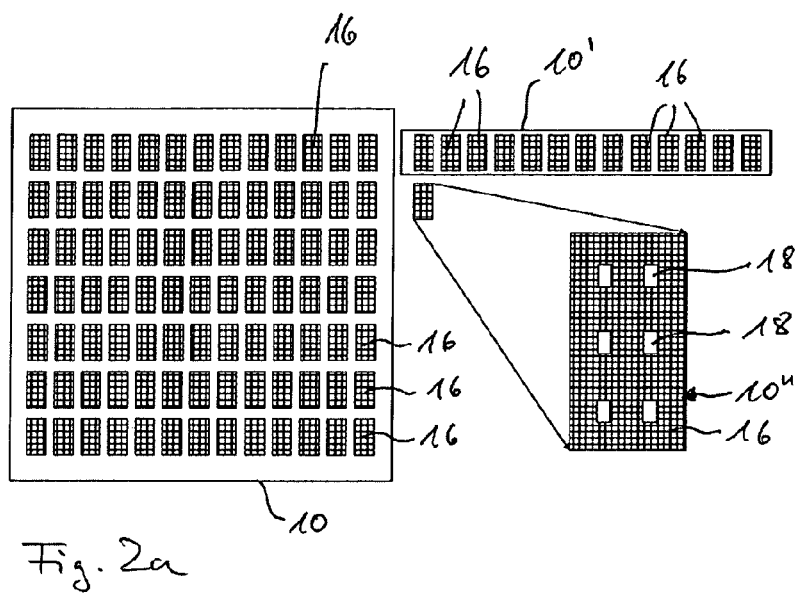

According to an embodiment of the invention, the substrate 10 may be singularized (or separated) after the process step illustrated in FIG. 2, as depicted in FIG. 2a.

FIG. 2a shows on the left a plan view of a substrate 10 with a plurality (91 in the exemplary embodiment depicted) of device cards to be equipped with devices. As may be discerned in the illustration of FIG. 2a on the right, a singularization for the purpose of insertion (of electronic components 20 as previously described) may be carried out as strips 10' or as individual cards 10". In this exemplary embodiment, the individual card 10' (illustrated in close-up) has six cutouts 18. After the components to be inserted have been inserted into the cutouts, the strips or individual cards are again reassembled, e.g. by placing the strips or individual cards in a suitable tray (not depicted).

Figure 5:
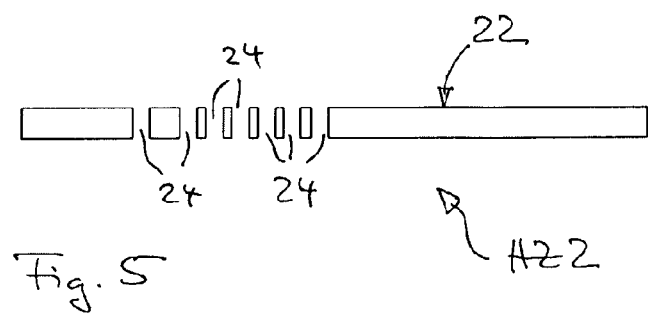
FIG. 5 illustrates the making in accordance with the invention of a second semi-finished product in producing an electronic device.

To make a second semi-finished product HZ2 in accordance with the invention, a first plate element 22 of electrically conductive material is now provided (cf. FIG. 5). This first plate element is a planar element, e.g. a sheet of a suitable electrically conductive material. The material used may be copper, for the reasons set forth above. The dimensions of the first plate element are based on the measurements of the substrate 10, for reasons relating to the further processing steps to be described below; in the exemplary embodiment described, these dimensions are approximately 600 mm×600 mm. The thickness of the plate may be approximately 0.2 mm; however, the person skilled in the art may choose a thicker or thinner plate, depending on the requirements in each particular case.

After the step of providing, through holes 24 are drilled into the plate element at one or more locations to subsequently form plated-through holes (feedthroughs). The feedthrough holes 24 may be created through drilling, stamping, etching, the use of lasers, or other methods familiar to the person skilled in the art.

After this step, the second semi-finished product HZ2 in accordance with the invention is complete.

Next, a second plate element 26 of electrically conductive material is provided as the third semi-finished product HZ3 (not depicted separately).

Aligning elements serving to align the two semi-finished products with each other when forming the layered structure that are in principle known to the person skilled in the art may be provided in the first semi-finished product HZ1 and the third semi-finished product HZ3.

In order to ensure better adhesion of the laminating resins used, the upper surfaces of all or individual ones of the three semi-finished products HZ1, HZ2, HZ3 may be made rough by means of suitable methods, and/or coated with adhesionpromoting layers (bonding agents), before the layers are assembled in the following step. In the case of the first semi-finished product, a suitable bonding agent may be applied simultaneously to both the surface of the semi-finished product and the surface of the electronic component.

FIG. 6 illustrates the arrangement of the three semi-finished products HZ1, HZ2, HZ3 produced thus far.

The first semi-finished product HZ1 is placed onto the third semi-finished product HZ3, with the side of the first semi-finished product HZ1 with inserted component 20 facing upward and thus away from the third semi-finished product HZ3. Before being placed onto each other, a first prepreg layer 34 is positioned between the two semi-finished products. This first prepreg layer 34 may be designed in such a way that it does not extend into the opposing interlocking parts of any aligning elements present.

After a second prepreg layer 36 has been placed into position, the second semi-finished product HZ2 is placed onto the first layer 16 on the upper side 12 of the first semi-finished product HZ1 in such a way that the through holes 24 of the second semi-finished product HZ2 are located in the desired orientation above the electronic component 20, such that they can subsequently serve as plated-through holes or feedthroughs to the component 20.

Optionally, the prepreg may be pre-perforated in the area of the future feedthroughs (through holes 24). To this end, the glass mesh in the area of the preformed holes is removed, facilitating the ensuing laser drilling process when the prepreg is placed into position and aligned with the feedthrough holes 24, as the laser need only remove the resin after the laminating process.

In selecting the prepreg layers, favorable thermal conductivity of the material is an important consideration. For example, highly thermally conductive material may be used. Prepregs with resins containing highly conductive fillers, e.g. Al2O3 or TiN, may be used. The thickness of the prepreg layer is chosen based on the necessary thermal conductivity as well as other parameters, e.g. dielectric strength.

The sandwich structure (layered structure) of FIG. 6 thus created is then pressed together or laminated under process parameters known to the person skilled in the art.

Figure 7:
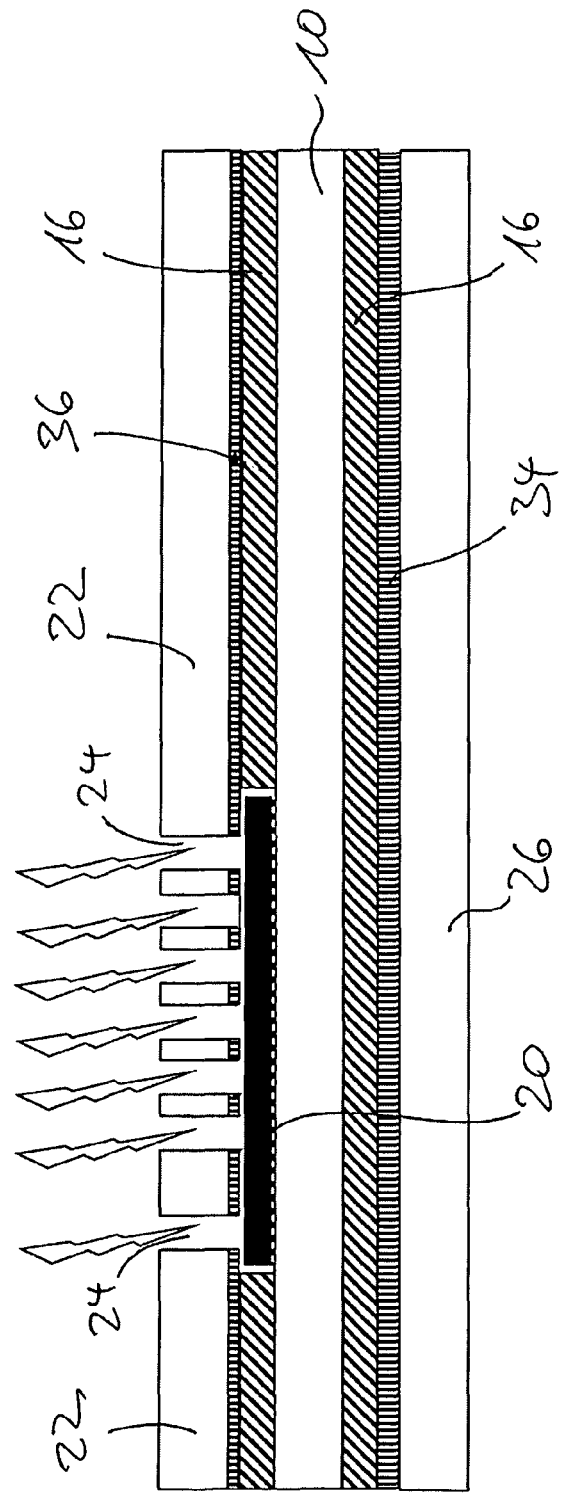

In a following process step, the feedthrough holes 24 filled with prepreg resin during the laminating process are uncovered (including any glass fibers present). This may be carried out by means of suitable measures known to one skilled in the art, e.g. via laser, as indicated in FIG. 7 by stylized laser flashes.

After the removal of the dielectric from the through holes 24, a thin electrically conductive layer is formed in a known manner on the dielectric walls of the holes 24 directly above the electronic component 20 due to the prepreg layer 36. This layer may be created e.g. through chemical deposition of copper, for example.

Figure 8:
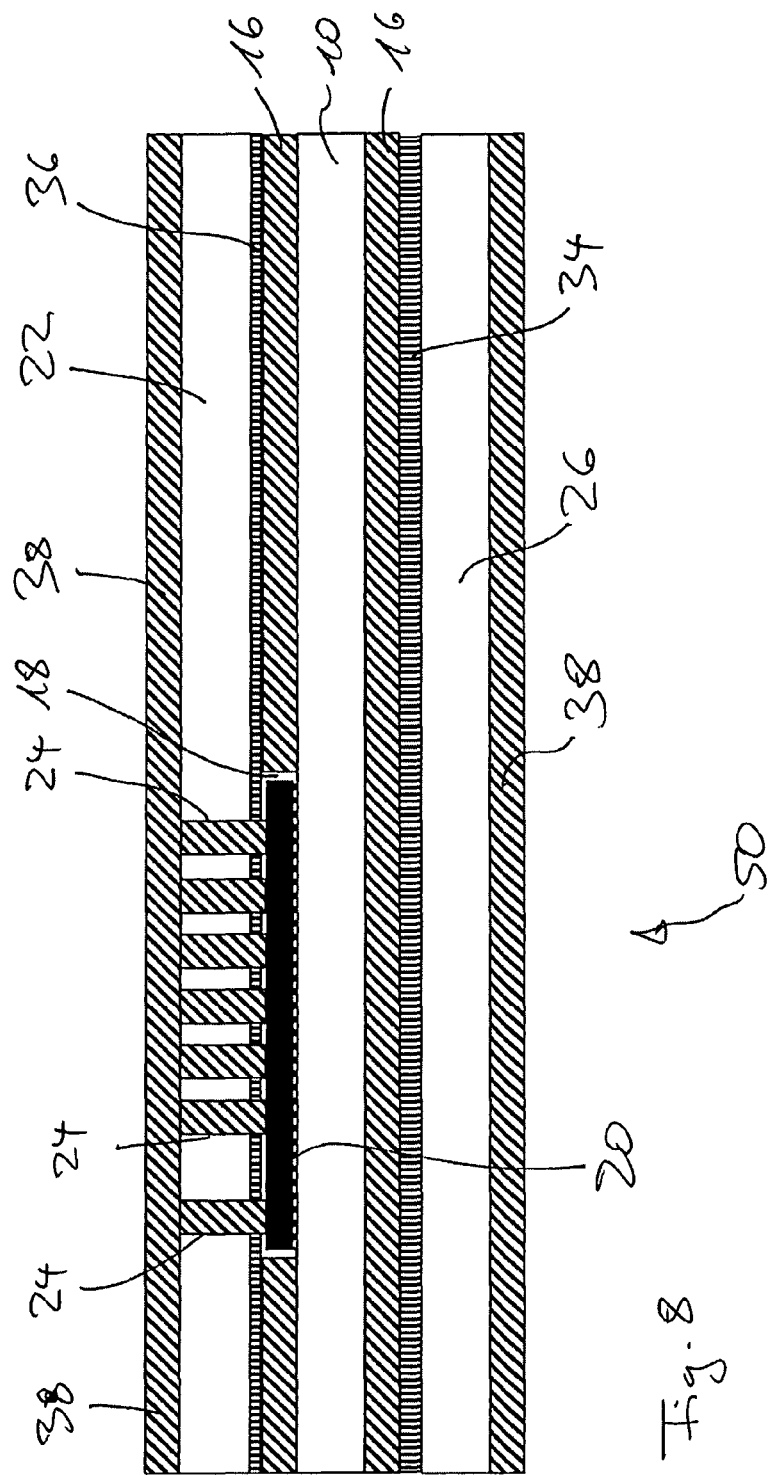
Figure 3:
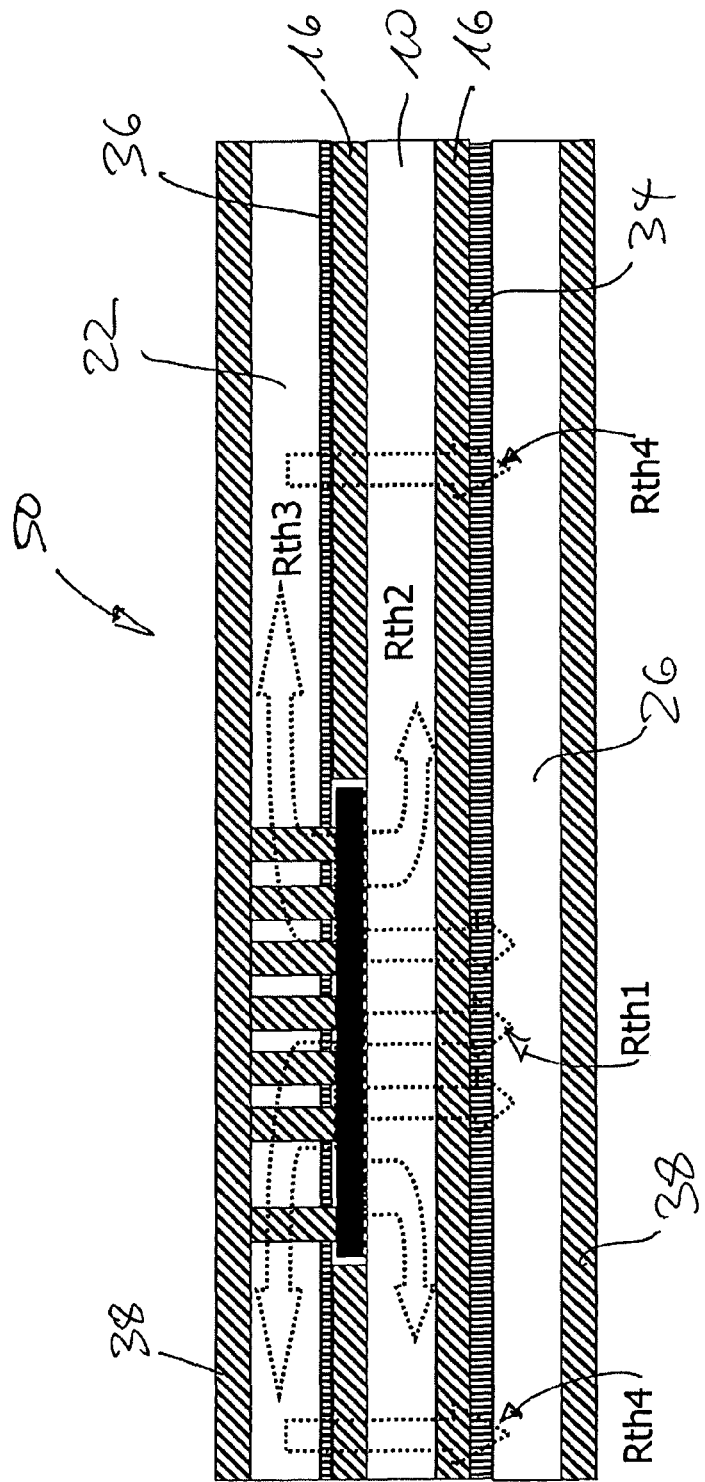
Figure 8:
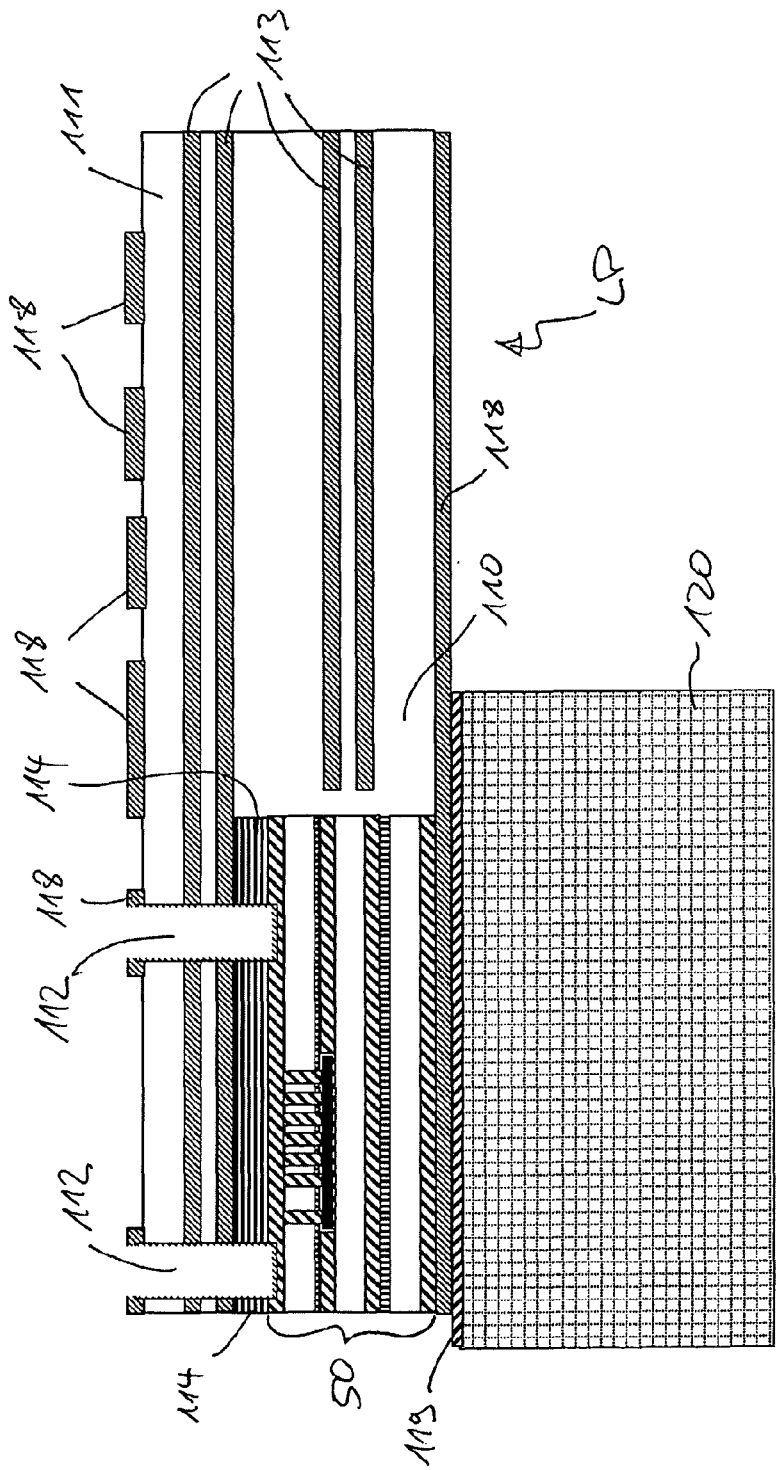

A covering layer 38 of electrically conductive material is then applied to the uppermost layer 22 of the intermediate laminated structure thus created. This electrically conductive material may again consist e.g. of copper, applied galvanically in such a manner that the feedthrough holes 24 are completely filled or at least filled sufficiently so that good contacting with the electronic component 20 located below is ensured. The covering layer may also—as represented in the exemplary embodiment of FIG. 8—be applied to the bottom side (bottom layer 26) of the intermediate laminated structure.

FIG. 9 shows a sectional view of an electronic device 50 in accordance with the invention, consisting of a copper or metal core from the previous substrate 10 and the galvanic copper or metal layers 16 deposited on it, on which (above and below) are arranged thermally conductive dielectric layers 34, 36, and on which are arranged in turn (above and below) further copper or metal layers 22, 26, 38 with an embedded component or chip 20 which is contacted by means of metal/copper vias 24.

This structure of an electronic device in accordance with the invention is a stable and thermally highly efficient design, which, in comparison with ceramic substrates of comparable performance, is significantly less expensive to produce, is more downwardly scalable, and is more resistant to breakage. The method of galvanic contacting permits smaller chips, as no thick wires for bonding need be taken into account.

In FIG. 9, the heat dissipation paths of the device 50 are indicated by dotted arrows, connected with various thermal resistances Rth1 through Rth4. As may be discerned from this illustration, the device 50 constructed in accordance with the invention exhibits a number of such heat dissipation paths, which serve specifically to conduct away heat generated in the electronic component. This is accomplished, among other means, by using two copper levels for an electrical and thermal connection. This permits the use of components with higher performance for the same surface area (higher performance density) and/or an increase in available surface in the design of the conductive path structures, without risk of overheating. This effect is used for heat spreading, i.e. thermal resistance decreases proportionally to the increase in cross-sectional area.

Materials used in connection with the present invention are advantageously characterized by especially advantageous thermal conductivity coefficients. Standard prepreg resin materials demonstrate a thermal conductivity of approximately 0.2 to 0.3 W/mK. However, materials with a thermal conductivity of 0.8 to 2.0 W/mK are possible.

Advantageously, the surfaces of the fields or arrays F1, F2, F3 and a third of the surface of field F4 are of the same size (cf. also FIG. 4), in order that each component have available to it the same surface for heat spreading. It is taken into account here that fields on which multiple components/chips are to be arranged require a surface as many times larger as that provided for a field with a single component as there are components on the field in order to ensure the even heat transfer intended by the invention. This avoids the situation wherein, due to differing geometries, one chip heats up more than the others (the "hot spot" effect), forcing the performance of the entire system to be reduced in order to cool down the one hotter chip.

The device 50 produced in accordance with the invention may be integrated into a printed circuit board, as illustrated in FIG. 10.

To this end, the electronic device 50 is inserted in a recess of the printed circuit board designed for the purpose and pressed together with this in such a manner that, after completion of the pressing process, the upper surface of the printed circuit board is flush with the upper surface of the device. In the illustration in FIG. 10, white layers of the printed circuit board LP represent dielectric layers 110, 111, and shaded layers represent conductive layers 113. Two drawn-in stud holes 112 serve to contact the device 50 with the printed circuit board LP. A (horizontally shaded) layer 114 with low thermal conductivity is located directly above the device 50. Between the heat sink 120 and a lower (copper) outer layer 118 of the printed circuit board LP, a TIM layer 119 may be provided to form a thermally uninterrupted junction (TIM: thermal interface material).

Figure 11:
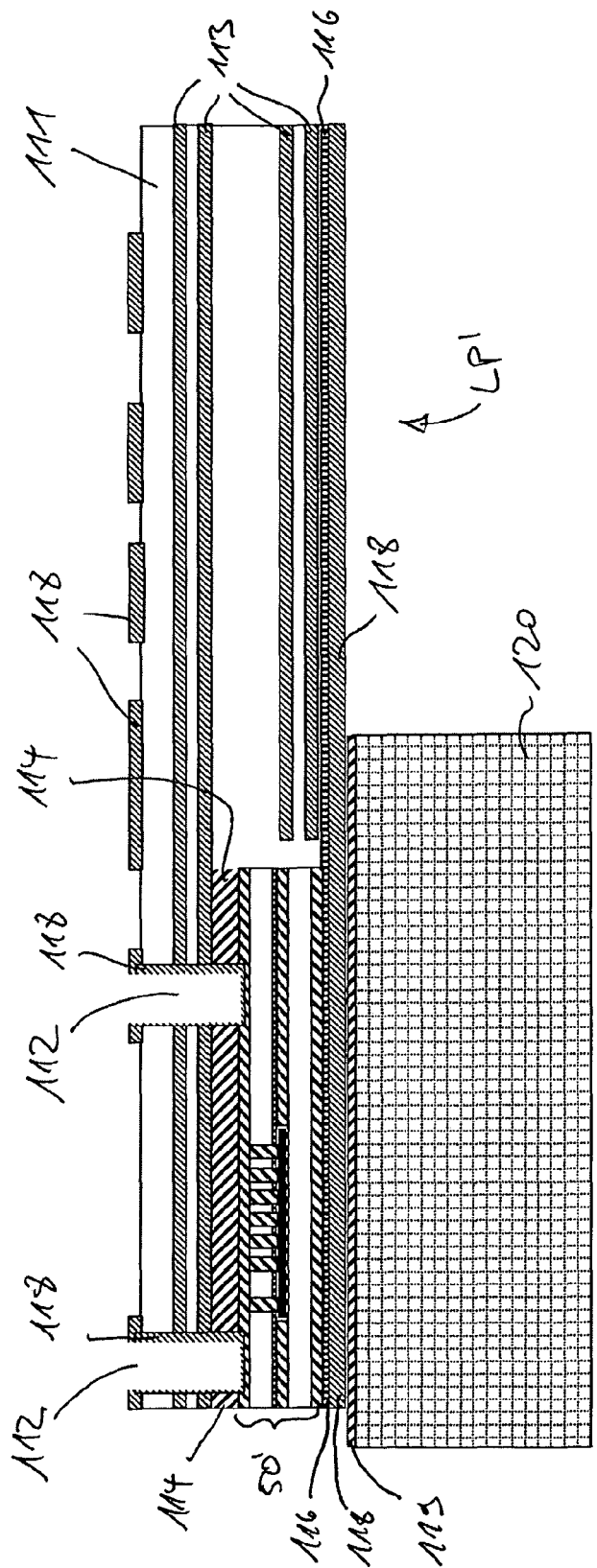
FIG. 11 shows a further embodiment of a printed circuit board comprising an integrated device in accordance with the invention, illustrated in cross-section.

When installed in a printed circuit board LP, the third semi-finished product HZ3 may alternatively be omitted above the layer sequence 34, 26, 38. An example of such a variant is represented in FIG. 11. Here, an electronic device 50' is directly integrated into a printed circuit board LP' without the third semi-finished product HZ3. The printed circuit board LP' exhibits generally the same structure as in FIG. 10, except that a thermally conductive prepreg 116 additionally extends across the bottom side of the printed circuit board and the integrated device 50'. A copper layer 118 is then applied as a common outer layer of the printed circuit board and the device 50' (created simultaneously with the galvanic application of a covering layer to form the plated-through contacts of the stud holes 112 on the upper side of the printed circuit board). During the integration of the device 50' with the printed circuit board LP', these are pressed together with this thermally conductive outer dielectric layer. Beneath the device 50', the bottom side of the outer layer 116 is again followed by the copper layer 118, a TIM layer 119, and a heat sink 120.

Figure 12:
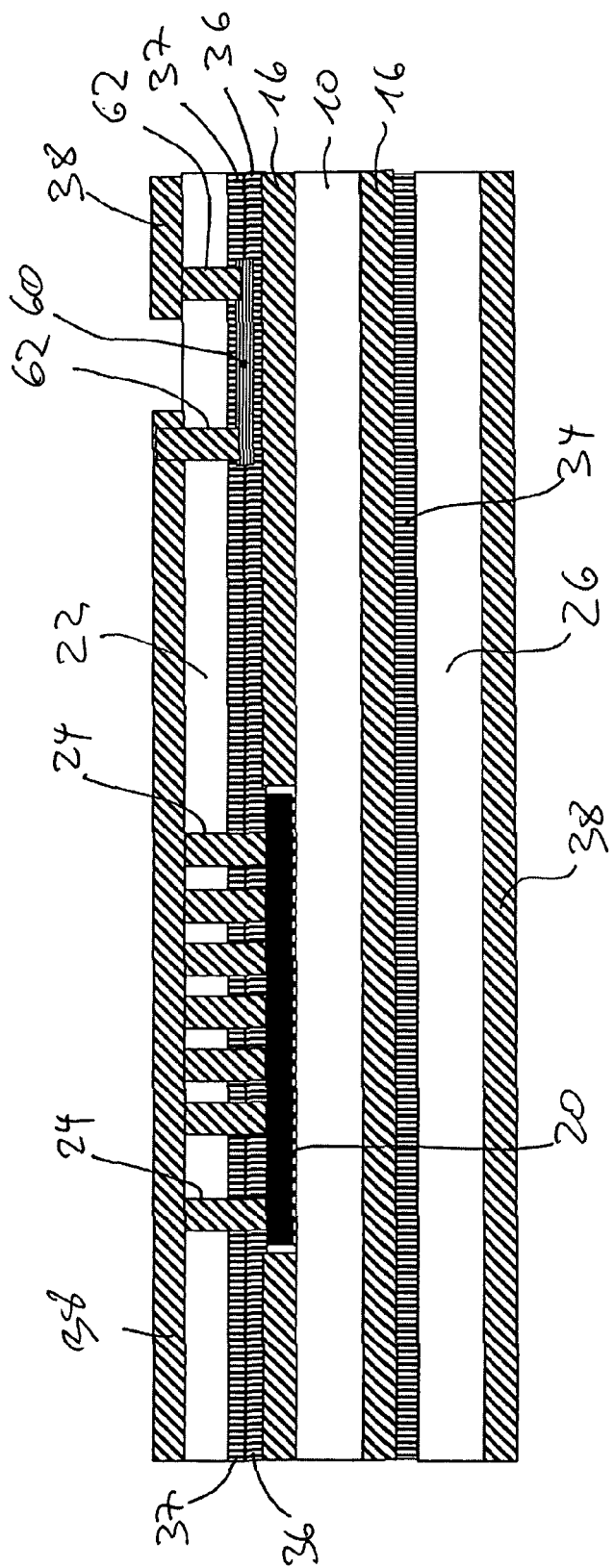
FIG. 12 shows a lateral section of a device in accordance with the invention comprising an integrated component.

Alternatively, the printed circuit board may be designed in such a manner that it extends beneath the device and assumes the function of a heat sink surface (not depicted) fulfilled by the heat sink 120 in the two embodiments represented in FIGS. 11 and 12.

The area of the printed circuit board above the device may—as previously indicated—be designed in such a way that a poor upward heat conduction results. In this way, overheating of any temperature-sensitive components on the printed circuit board is prevented or at least minimized.

To this end, as an alternative or in addition to the layer 114 with low thermal conductivity represented in FIGS. 11 and 12, at least one cavity (not depicted) may be provided in this layer 114 above and directly adjoining the device. The electrical and mechanical connection of the device to the printed circuit board is then accomplished via the lateral edges and remaining portions of the surface.

According to an embodiment of the invention, two prepreg layers 36, 37 may be positioned between the first semi-finished product HZ1 and the second semi-finished product HZ2, between which a component is in turn positioned. This component may be e.g. a component 60 for current measurement or current sensing (a shunt) (in the embodiment illustrated, a film component; cf. FIG. 12). This component is contacted—as previously described in a different context—e.g. by means of plated-through laser holes 62.

Figure 13:
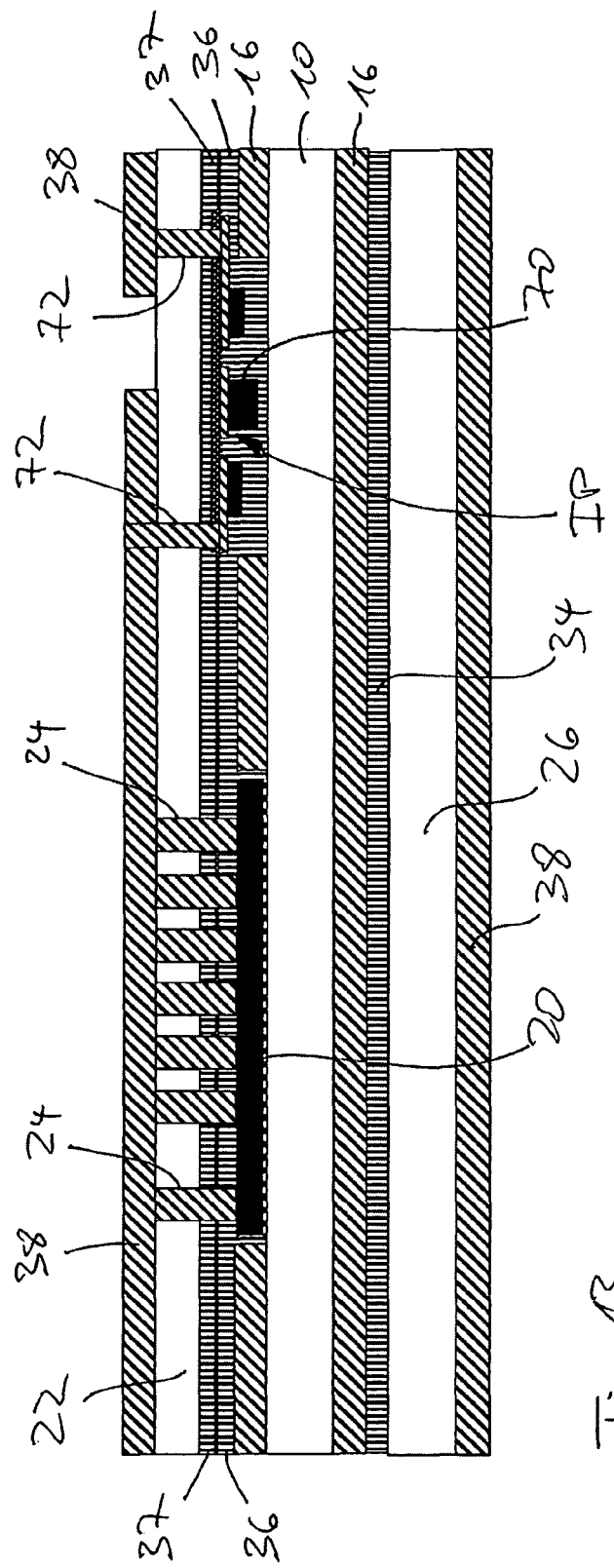
FIG. 13 shows a lateral section of a device in accordance with the invention comprising an integrated interposer and component.

In a further embodiment—much as described in connection with FIG. 12—at least one passive, discrete component 70 may be positioned between the two prepreg layers 36, 37 between the first semi-finished product HZ1 and the second semi-finished product HZ2, e.g. by means of an interposer IP, as depicted in FIG. 13. Depending on the height of such an item, a cavity 17 may be provided in the first semi-finished product HZ1 to receive the interposer IP. Contacting is done again by means of plated-through laser holes 72 or by comparable means.

Aspects of the invention are summarized in the following enumerated list of aspects:

1. An electronic device (50) comprising an electrically conductive core layer (10) with a first layer (16) composed of electrically conductive material, said first layer being applied on both sides, and with at least one electronic component (20) arranged in a cutout (18) of the first layer (16), wherein the first layer (16) is covered in each case with an electrically insulating, thermally conductive layer (34, 36), and a further layer (22, 26) composed of electrically conductive material is provided in each case on the thermally conductive layer (34, 36), said further layer being coated in each case with a covering layer (38) composed of electrically conductive material, and furthermore comprising plated-through holes (24) composed of the material of the covering layer (38), the holes (24) extending through the electrically insulating, thermally conductive layer (36) covering the electronic component (20) and the further layer (22) composed of electrically and thermally conductive material for the purpose contacting the electronic component (20).

2. The electronic device (50) in accordance with Aspect 1, wherein the core layer (10) consists of copper or of copper-plated aluminum.

3. The electronic device (50) in accordance with Aspect 1 or 2, wherein the first layer (16) is galvanically deposited copper.

4. The electronic device (50) in accordance with any one of Aspects 1 to 3, wherein a depth (d) of the cutout (18) is somewhat greater than the height of the electronic component (20) plus a connective layer (19).

5. The electronic device (50) in accordance with any one of Aspects 1 to 4, wherein, in the event of more than one electronic component (20), each component (20) is assigned a surface for heat dissipation or spreading in such a manner that the heat dissipation or spreading surface for each installed component (20) is practically identical.

6. An electronic device (50) comprising an electrically conductive core layer (10) with a first layer (16) composed of electrically conductive material, said first layer being applied on both sides, and with at least one electronic component (20) arranged in a cutout (18) of the first layer (16), wherein the first layer (16) above the electronic component (20) is covered with an electrically insulating, thermally conductive layer (36) and a further layer (22) composed of electrically conductive material is provided on the thermally conductive layer (36), said further layer being coated with a covering layer (38) composed of electrically conductive material, and furthermore comprising plated-through holes (24) composed of the material of the covering layer (38), the holes extending through the electrically insulating, thermally conductive layer (36) covering the electronic component (20) and the further layer (22) composed of electrically and thermally conductive material for the purpose of contacting the electronic component (20).

The device in accordance with Aspect 6 is intended as an intermediate product, e.g. for integration into a printed circuit board, as described herein and in the description with reference to the exemplary embodiment of FIG. 11.

7. The electronic device (50') in accordance with Aspect 6, in which the core layer (10) consists of copper or of copper-plated aluminum.

8. The electronic device (50') in accordance with Aspect 6 or 7, in which the first layer (16) is galvanically deposited copper.

xx

9. The electronic device (50') in accordance with any one of Aspects 6 to 8, in which the depth (d) of the cutout (18) is somewhat greater than the height of the electronic component (20) plus a connective layer (19).

10. The electronic device (50') in accordance with any one of Aspects 6 to 9, in which, in the event of more than one electronic component (20), each component (20) is assigned a surface for heat dissipation or spreading in such a manner that the heat dissipation or spreading surface for each installed component (20) is practically identical.

11. A method of making an electronic device (50) comprising the following steps:
  making a first semi-finished product (HZ1) by
    providing a substrate (10) of electrically conductive material having an upper side (12) and a bottom side (14);
    applying a first layer (16) of conductive material on the upper side (12) and/or the bottom side (14) of the substrate (10), with at least one cutout (18) for receiving an electronic component being provided in the first layer (16);
    inserting at least one component (20) in the at least one cutout (18);
  making a second semi-finished product (HZ2) by
    providing a first plate element (22) of electrically conductive material;
    creating holes (24) in the first plate element (22) of holes (24) to subsequently form plated-through holes;
  making a third semi-finished product (HZ3) by
    providing a second plate element (26) of electrically conductive material;
    arranging the three semi-finished products (HZ1, HZ2, HZ3) as a layered structure by placing the first semi-finished product (HZ1) on the third semi-finished product (HZ3), and by placing the second semi-finished product (HZ2) on the first semi-finished product (HZ1), with prepreg layers (34, 36) being provided in between, respectively;
  laminating the structure,
  uncovering the resin-filled holes (24) of the first plate element (22) after the step of laminating,
  at least partially filling the holes (24) with conductive material for the purpose of creating a contact.

12. The method in accordance with Aspect 11, wherein the substrate (10) consists of copper or copper-plated aluminum.

13. The method in accordance with Aspect 11 or 12, wherein the application of the first layer (16) is carried out by means of galvanic deposition.

14. The method in accordance with any one of Aspects 11 to 13, wherein the cutout (18) is formed by selectively applying the first layer (16) in such a manner that a depth (d) of the cutout (18) is somewhat greater than the height of the electronic component (20) to be inserted plus a connective layer (19).

15. The method in accordance with any one of Aspects 11 to 14, wherein, after the step of inserting the at least one electronic component (20), recesses in the cutout (18) around the component (20) are filled before the pressing stage.

16. The method in accordance with any one of Aspects 11 to 15, wherein channels (K1, K2, K3) are generated in the first layer (16) and the substrate (10), the channels having retaining studs (S) to be removed after the step of laminating.

17. A method of making an electronic device (50') comprising the following steps:
  making a first semi-finished product (HZ1) by
    providing a substrate (10) of electrically conductive material with an upper side (12) and a bottom side (14);
    applying/depositing a first layer (16) of conductive material on the upper side (12) and/or the bottom side (14) of the substrate (10), with at least one cutout (18) for receiving an electronic component being provided in the first layer (16);
    inserting a component (20) in the at least one cutout (18);
  making a second semi-finished product (HZ2) by
    providing a first plate element (22) of electrically conductive material;
    creating holes (24) in the first plate element (22) to subsequently form plated-through holes;
  arranging the two semi-finished products (HZ1, HZ2) as a layered structure by placing the second semi-finished product (HZ2) on the first semi-finished product (HZ1), with a prepreg layer (36) being provided in between;
  laminating the structure,
  uncovering the holes (24) in the first plate element (22) filled with resin after the laminating process;
  at least partially filling the holes (24) with conductive material (38) for the purpose of forming plated-through holes.

18. The method in accordance with Aspect 17, wherein the substrate (10) consists of copper or copper-plated aluminum.

19. The method in accordance with Aspect 17 or 18, wherein the application of the first layer (16) is carried out by means of galvanic deposition.

20. The method in accordance with any one of Aspects 17 to 19, wherein the cutout (18) is formed by selectively applying the first layer (16) in such a manner that a depth (d) of the cutout (18) is somewhat greater than the height of the electronic component to be inserted (20) plus a connective layer (19).

21. The method in accordance with any one of Aspects 17 to 20, wherein, after the step of inserting the at least one electronic component (20), recesses in the cutout (18) around the component (20) are filled before the pressing stage.

22. The method in accordance with any one of Aspects 17 to 21, wherein channels (K1, K2, K3) are generated in the first layer (16) and the substrate (10), the channels having retaining studs (S) to be removed after the step of laminating.

23. A printed circuit board (LP) with an electronic device (50) in accordance with any one of Aspects 1 to 5.

24. The printed circuit board (LP) in accordance with Aspect 23, in which a surface of the printed circuit board (LP) terminates flush with the electronic device (50).

25. The printed circuit board (LP) in accordance with Aspect 24, in which a heat sink (120) is connected to the flush junction of the printed circuit board (LP) and the electronic device (50).

26. The printed circuit board (LP) in accordance with any one of Aspects 23 to 25, in which the placement of a layer (114) with low thermal conductivity is intended between the electronic device (50) and conductive paths (113) of the printed circuit board (LP) located above.

27. A printed circuit board (LP') with an electronic device (50') in accordance with any one of Aspects 6 to 10.

28. The printed circuit board (LP') in accordance with Aspect 27, in which an insulating portion (110) of the printed circuit board (LP') terminates flush with the electronic device (50').

29. The printed circuit board (LP') in accordance with Aspect 28, in which a heat sink (120) is connected to the flush junction of the printed circuit board (LP') and electronic device (50').

30. The printed circuit board in accordance with any one of Aspects 27 to 29, in which a layer (114) with low thermal conductivity is provided between the electronic device (50') and conductive paths (113) of the printed circuit board (LP') located above.

31. The method in accordance with any one of Aspects 11 to 22, wherein, during the step of arranging, two prepreg layers (36, 37) are placed between the first semi-finished product (HZ1) and the second semi-finished product (HZ2), with an additional component (60) and/or an interposer (IP) being positioned between the two prepreg layers (36, 37), the component or interposer being contacted via through-plated holes (62, 72) after the step of pressing.

32. The method in accordance with Aspect 31, wherein the holes (62, 72) for contacting the additional component (60) and/or the interposer (IP) are created via laser drilling followed by plating.

33. The method in accordance with Aspect 31 or 32, wherein, during the step of making the second semi-finished product (HZ2), through holes for contacting the additional component (60) and/or the interposer (IP) are provided.

34. The method in accordance with any one of Aspects 31 to 33, wherein a cavity (17) is provided for receiving the additional component (60) and/or the interposer (IP).

35. The electronic device (50, 50') in accordance with any one of Aspects 1 to 10, further comprising an additional component (60) and/or an interposer (IP) between two electrically insulating layers (36, 37).

36. A method for integrating an electronic device (50, 50') into a printed circuit board, comprising the steps of
    providing an electronic device (50, 50') in accordance with any one of Aspects 1 to 10 or in accordance with Aspect 35;
    providing a printed circuit board comprising a recess for receiving the electronic device (50, 50');
    inserting a layer (114) with low thermal conductivity into the recess;
    inserting the electronic device (50, 50') into the recess of the printed circuit board on the layer (114) with low thermal conductivity;
    pressing together the layered structure created thereby;
    applying an electrically conductive layer (118) forming a common outer layer which also serves for contacting the electronic device (50, 50') with the printed circuit board (LP, LP').

37. The method in accordance with Aspect 36, wherein a heat sink (120) is mounted on the layer forming a common outer layer (118) in the area of the electronic device (50, 50').

38. The method in accordance with Aspect 37, wherein a TIM layer (119) is placed between the electrically conductive layer (118) and the heat sink (120) to form a thermally uninterrupted junction.

39. The method in accordance with any one of Aspects 36 to 38, wherein a thermally conductive dielectric (116) is placed between the printed circuit board with an inserted electronic device on the one hand and the common outer layer (118) on the other hand.

The invention claimed is:

1. An electronic device, comprising:
   a) an electrically conductive core layer with a first layer composed of electrically conductive material, the first layer being applied on both sides, and with at least one electronic component arranged in a cutout of the first layer; and
   b) wherein the first layer having the cutout and the at least one electronic component arranged in the cutout are covered with an electrically insulating, thermally conductive layer and a further layer composed of electrically conductive material is provided on the electrically insulating, thermally conductive layer, the further layer being coated with a covering layer composed of electrically conductive material, and the electrically insulating, thermally conductive layer and the further layer furthermore comprising plated-through holes composed of the electrically conductive material of the covering layer, the plated-through holes extending through the electrically insulating, thermally conductive layer covering the at least one electronic component and the further layer composed of electrically and thermally conductive material for a purpose of making contact with the at least one electronic component.

2. The electronic device in accordance with claim 1, wherein in an event of the at least one electronic component is more than one, each component is assigned a surface for heat spreading in such a manner that the heat spreading surface for each of the installed at least one electronic component is substantially identical.

3. An electronic device, comprising:
   a) an electrically conductive core layer with a first layer composed of electrically conductive material, the first layer being applied on both sides of the electrically conductive core layer, and with at least one electronic component arranged in a cutout of the first layer; and
   b) wherein the first layer in each case and the at least one electronic component are covered with an electrically insulating, thermally conductive layer, and a further layer composed of electrically conductive material is provided in each case on the electrically insulating, thermally conductive layer, the further layer being coated in each case with a covering layer composed of electrically conductive material, and the electrically insulating, thermally conductive layer and the further layer furthermore comprising plated-through holes composed of the electrically conductive material of the covering layer, the plated-through holes extending through the electrically insulating, thermally conductive layer covering the at least one electronic component and the further layer composed of electrically and thermally conductive material for a purpose of making contact with the at least one electronic component.

4. The electronic device in accordance with claim 3, wherein in an event of the at least one electronic component is more than one, each component is assigned a surface for heat spreading in such a manner that the heat spreading surface for each of the installed at least one electronic component is substantially identical.

5. A printed circuit board, comprising:
   a) an electronic device; and
   b) the electronic device comprising an electrically conductive core layer with a first layer composed of electrically conductive material, the first layer being applied on both sides, and with at least one electronic component arranged in a cutout of the first layer; wherein the first layer in each case and the at least one electronic component are covered with an electrically insulating, thermally conductive layer, and a further layer composed of electrically conductive material is provided in each case on the electrically insulating, thermally conductive layer, the further layer being coated in each case with a covering layer composed of electrically conductive material, and the electrically insulating, thermally conductive layer and the further layer furthermore comprising plated-through holes composed of the electrically conductive material of the covering layer, the plated-through holes extending through the electrically insulating, thermally conductive layer covering the at least one electronic component and the further layer composed of electrically and thermally conductive material for a purpose of making contact with the at least one electronic component.

6. The printed circuit board in accordance with claim 5, wherein a surface of the printed circuit board terminates flush with the electronic device, and a heat sink is connected to the flush junction of the printed circuit board and the electronic device.

7. The printed circuit board in accordance with claim 5, wherein a layer with low thermal conductivity is provided between the electronic device and conductive paths of the printed circuit board located above the electronic device.

8. A method for integrating an electronic device into a printed circuit board, comprising the steps of
  a) providing the electronic device comprising an electrically conductive core layer with a first layer composed of electrically conductive material, the first layer being applied on both sides, and with at least one electronic component arranged in a cutout of the first layer; wherein the first layer in each case and the at least one electronic component are covered with an electrically insulating, thermally conductive layer, and a further layer composed of electrically conductive material is provided in each case on the electrically insulating, thermally conductive layer, the further layer being coated in each case with a covering layer composed of electrically conductive material, and the electrically insulating, thermally conductive layer and the further layer furthermore comprising plated-through holes composed of the electrically conductive material of the covering layer, the plated-through holes extending through the electrically insulating, thermally conductive layer covering the at least one electronic component and the further layer composed of electrically and thermally conductive material for a purpose of making contact with the at least one electronic component;
  b) providing the printed circuit board comprising a recess for receiving the electronic device;
  c) inserting a layer with low thermal conductivity into the recess;
  d) inserting the electronic device into the recess of the printed circuit board on the layer with low thermal conductivity;
  e) pressing together the layered structure created thereby; and
  f) applying an electrically conductive layer forming a common outer layer which also serves for contacting the electronic device with the printed circuit board.

9. The method in accordance with claim 8, wherein a heat sink is mounted on the layer forming the common outer layer in an area of the electronic device.

10. The method in accordance with claim 9, wherein a TIM layer is placed between the electrically conductive layer forming the common outer layer and the heat sink to form a thermally uninterrupted junction.

11. The method in accordance with claim 8, wherein a thermally conductive dielectric is placed in between the printed circuit board having the inserted electronic device and the common outer layer.

12. A method of making an electronic device, comprising the following steps:
  a) making a first semi-finished product by
    i) providing a substrate of electrically conductive material with an upper side and a bottom side;
    ii) applying/depositing a first layer of conductive material on at least one of the upper side or the bottom side of the substrate, the first layer having at least one cutout, each cutout for receiving a respective one of at least one electronic component being provided in the first layer; and
    iii) inserting the respective one of the at least one electronic component in each of the at least one cutout;
  b) making a second semi-finished product by
    i) providing a first plate element of electrically conductive material; and
    ii) creating holes in the first plate element to subsequently form plated-through holes;
  c) arranging the two semi-finished products as a layered structure by placing the second semi-finished product on the first semi-finished product, with a prepreg resin layer being provided in between;
  d) laminating the structure;
  e) uncovering the holes in the first plate element filled with the resin after the laminating process; and
  f) at least partially filling the holes with conductive material for a purpose of forming the plated-through holes.

13. The method in accordance with claim 12, wherein, after the step of inserting the respective one of the at least one electronic component, recesses in each of the at least one cutout around the respective one of the at least one electronic component are filled before the step of arranging.

14. A method of making an electronic device, comprising the following steps:
  a) making a first semi-finished product by
    i) providing a substrate of electrically conductive material having an upper side and a bottom side;
    ii) applying a first layer of conductive material on at least one of the upper side or the bottom side of the substrate, the first layer having at least one cutout, each cutout for receiving a respective one of at least one electronic component being provided in the first layer; and
    iii) inserting the respective one of the at least one electronic component in each of the at least one cutout;
  b) making a second semi-finished product by
    i) providing a first plate element of electrically conductive material; and
    ii) creating holes in the first plate element to subsequently form plated-through holes;
  c) making a third semi-finished product by providing a second plate element of electrically conductive material;
  d) arranging the three semi-finished products as a layered structure by placing the first semi-finished product on the third semi-finished product, and by placing the second semi-finished product on the first semi-finished product, with at least one prepreg resin layer being provided in between, respectively;
  e) laminating the structure;
  f) uncovering the resin-filled holes of the first plate element after the step of laminating; and
  g) at least partially filling the holes with conductive material forming the plated-through holes and for a purpose of creating a contact.

15. The method in accordance with claim 14, wherein, after the step of inserting the respective one of the at least one electronic component, recesses in each of the at least one cutout around the respective one of the at least one electronic component are filled before the step of arranging.

16. The method in accordance with claim 14, wherein channels are generated in the first layer and the substrate, the channels having retaining studs, the retaining studs to be removed after the step of laminating.

17. The method in accordance with claim 14, wherein, during the step of arranging, the at least one prepreg resin layer between the first semi-finished product and the second semi-finished product is two prepreg resin layers placed between the first semi-finished product and the second semi-finished product, with at least one of an additional component or an interposer being positioned between the two prepreg resin layers, the at least one of the additional component or the interposer being contacted via through-plated holes after the step of laminating.

18. The method in accordance with claim 17, wherein, during the step of making the second semi-finished product, through holes for contacting the at least one of the additional component or the interposer are provided, the through holes to subsequently form the through-plated holes.

* * * * *